(12) United States Patent
Su et al.

(10) Patent No.: US 8,893,069 B2
(45) Date of Patent: Nov. 18, 2014

(54) METHOD OF SCHEMATIC DRIVEN LAYOUT CREATION

(71) Applicants: Synopsys Taiwan Co., Ltd., Taipei (TW); Synopsys, Inc., Mountain View, CA (US)

(72) Inventors: Yu-Chi Su, Hsinchu (TW); Ming-I Lai, Tainan (TW); Hsiao-Tzu Lu, Hsinchu (TW)

(73) Assignees: Synopsys, Inc., Mountain View, CA (US); Synopsys Taiwan Co., Ltd., Taipei (TW)

( * ) Notice: Subject to any disclaimer, the term of this patent is extended or adjusted under 35 U.S.C. 154(b) by 16 days.

(21) Appl. No.: 13/646,664

(22) Filed: Oct. 6, 2012

(65) Prior Publication Data

US 2013/0091481 A1    Apr. 11, 2013

Related U.S. Application Data

(60) Provisional application No. 61/544,283, filed on Oct. 7, 2011.

(51) Int. Cl.
  *G06F 17/50*  (2006.01)

(52) U.S. Cl.
  CPC ........ *G06F 17/5068* (2013.01); *G06F 17/5063* (2013.01)
  USPC ........... 716/119; 716/102; 716/106; 716/107; 716/139

(58) Field of Classification Search
  USPC .................... 716/55, 102–107, 118, 119, 139
  See application file for complete search history.

(56) References Cited

U.S. PATENT DOCUMENTS

| | | | | |
|---|---|---|---|---|
| 6,574,779 | B2* | 6/2003 | Allen et al. .................... | 716/103 |
| 6,782,514 | B2* | 8/2004 | Bhattacharya et al. ........ | 716/105 |
| 7,418,683 | B1* | 8/2008 | Sonnard et al. ............... | 716/122 |
| 7,543,262 | B2* | 6/2009 | Wang et al. .................... | 716/119 |
| 7,665,054 | B1* | 2/2010 | Gopalakrishnan et al. ... | 716/122 |
| 7,735,036 | B2* | 6/2010 | Dennison et al. ............. | 716/106 |
| 7,739,646 | B2* | 6/2010 | Lin et al. ....................... | 716/119 |
| 7,861,193 | B2* | 12/2010 | Meserve ....................... | 716/102 |
| 7,873,928 | B2* | 1/2011 | Lin et al. ....................... | 716/119 |
| 2003/0059116 | A1* | 3/2003 | Kupeev et al. ................ | 382/203 |
| 2004/0019869 | A1* | 1/2004 | Zhang ............................ | 716/11 |
| 2004/0153278 | A1* | 8/2004 | Zhang et al. .................. | 702/117 |
| 2007/0006103 | A1* | 1/2007 | Zhang et al. ...................... | 716/1 |
| 2008/0282212 | A1* | 11/2008 | Dennison et al. ............... | 716/10 |
| 2009/0327988 | A1* | 12/2009 | Ladin et al. ...................... | 716/11 |
| 2010/0115487 | A1* | 5/2010 | Tripathi et al. .................. | 716/12 |
| 2011/0219352 | A1* | 9/2011 | Majumder et al. ............ | 716/139 |
| 2012/0011486 | A1* | 1/2012 | Reis et al. ...................... | 716/132 |
| 2012/0144360 | A1* | 6/2012 | Smayling et al. ............. | 716/119 |

\* cited by examiner

*Primary Examiner* — Nha Nguyen

(74) *Attorney, Agent, or Firm* — Kilpatrick Townsend & Stockton LLP

(57) ABSTRACT

A computer-implemented method is disclosed for layout pattern or layout constraint reuse by identifying sub-circuits with identical or similar schematic structure based on a topology comparison strategy. The selected sub-circuit is transformed into a topology representing the relative positions among the instances of the selected sub-circuit. Based on the topology, one or more sub-circuits with identical or similar topologies in a predefined scope of a schematic are recognized and identified. Accordingly, the layout or the layout constraint of the selected sub-circuit is copied and associated to each of the identified sub-circuits. Furthermore, once the sub-circuits are identified, they can be listed on a user interface with notations to allow users to confirm each of the identified sub-circuits respectively.

11 Claims, 6 Drawing Sheets

METHOD OF SCHEMATIC DRIVEN LAYOUT CREATION

CROSS REFERENCE TO RELATED APPLICATIONS

This application claims the benefit of priority of U.S. Provisional Application No. 61/544,283, filed Oct. 7, 2011, and titled "Schematic Driven Layout Creation that Takes Advantage of Similarities among Circuit Elements", the contents of which are herein incorporated by reference in its entirety.

BACKGROUND OF THE INVENTION

I. Field of the Invention

The invention relates in general to a computer-implemented method for electronic design automation (EDA) to generate a layout for a circuit and, in particular, to generate a layout for an analog circuit based on schematics.

II. Description of the Prior Art

Since invented in 1960s, the size of an integrated circuit (IC) has grown quickly. Twenty years ago, an IC might comprise hundreds to thousands of basic cells. Today, an IC may comprise thousands to millions of basic cells.

There are many forms to represent a circuit design; the forms mainly include a netlist and a schematic. A netlist which is described in text form lists all the components and the connections among the components. However, compared with a netlist, a schematic can further include the topology of all the components in the circuit. One could easily understand the structure of a circuit network with the schematic of the circuit network. That is, schematic design flow is a more intuitive way to design the circuit network. As a result, schematic design flow is nowadays broadly taken as a useful method for designing an analog IC.

As the IC nowadays includes thousands to millions of basic cells, it's getting more difficult for an engineer to draw the layout of each of basic cells. Consequently, it is desired to develop methods and/or tools to help engineers in order to reduce the time of drawing a layout. There are some electronic design automation (EDA) tools which are developed to cut short the time of drawing a layout. As described in U.S. Pat. No. 6,574,779, a sub-circuit in a netlist is compared with standard cells in a library. If the circuit structure of the sub-circuit, that is, the basic cells with parameters and the connection relationship thereof, is identical to one of the standard cells, the sub-circuit is recognized as the same as the standard cell; and the layout of the standard cell is then copied and associated to the sub-circuit. With this method, the time of drawing a layout is shortened.

While generating a layout of a digital circuit, a netlist design flow is usually useful because there are typically well-developed standard libraries for translating each gate of the digital circuit to a corresponding standard cell. The reason is that there are few variants of each type of basic functional block and most of them are well described. For example, there are only four types of broadly used full-adders, namely ripple adder, carry-look-ahead adder, carry-select adder, and Manchester chain. Further, in most of the IC design, the ripple adder meets the requirement and that kind of adder is supported and described in the standard library. Hence, netlist design flow is capable for generating the layout of a digital circuit.

However, the netlist design flow is not that powerful for saving the time of drawing a layout of an analog circuit and/or a high performance digital circuit. In an analog circuit design and/or a high performance digital circuit design, the circuit structures are usually different from typical circuit structures described in the standard library. As a result, most circuits in the analog circuit design and/or in the digital circuit design cannot be recognized with the netlist design flow. Thus, time of drawing a layout of an analog circuit and/or a high performance digital circuit can not be significantly reduced by using the netlist design flow.

Therefore, what is needed is a method which can recognize circuits which have similar circuit structures to allow circuit designers to reuse the layouts of those circuit structures. With such method, the time of drawing layout of analog circuits and/or high performance digital circuits can be significantly reduced.

SUMMARY OF THE INVENTION

One object of this invention is to provide a schematic driven layout (SDL) flow that helps users draw layout with maximum flexibility. In that way, engineers can design the circuit with a more intuitive schematic design flow.

One embodiment in the present invention is to recognize one or more sub-circuits of which the schematic topologies are identical or similar to that of a pattern sub-circuit which has a corresponding layout pattern or layout constraints already, wherein their internal connections among instances of the sub-circuit can be ignored. After one or more sub-circuits with identical or similar schematic topologies are recognized, the layout pattern or layout constraints of the pattern sub-circuit is then copied and associated to each of the one or more sub-circuits. Therefore, the sub-circuits with identical or similar schematic topologies but different circuit structures can be recognized. Furthermore, the time of designing the layout or specifying layout constraints is largely reduced. Another embodiment of the present invention is that an engineer can reuse those sub-circuits and layouts which were previously designed already. Thus, in the same generation of the solid-state circuit, a design can be reused as much as possible to save the time of layout design.

Furthermore, a method according to present invention can be applied to generating a layout of an integrated circuit (IC) or a printed circuit board (PCB).

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The detailed explanation of the present invention is described as the following. The described preferred embodiments are presented for purposes of illustrations and description, and they are not intended to limit the scope of the present invention.

In this invention, a novel schematic driven layout method is proposed for generating a layout of a circuit design which comprises a plurality of instances. The method according to present invention can be applied to generate a layout of an integrated circuit (IC) or a printed circuit board (PCB) because either one can use the schematic driven layout methodology.

In one embodiment, the method is applied to an analog IC design. A sub-circuit with a drawn layout is called a pattern sub-circuit, wherein the sub-circuit has an existing layout already and can be selected as a reference for comparing with other sub-circuits in the schematic. Please refer to FIG. 1 which depicts the flow chart in accordance with one embodiment of this invention. Firstly, as in step 11, a schematic is received for the IC design. The schematic comprises a plurality of sub-circuits, wherein each of the sub-circuits in the schematic comprises a plurality of instances and has a topology among the plurality of instances. Next, a sub-circuit with a drawn layout is selected, wherein the selected sub-circuit has a corresponding topology, as in step 12. The selected sub-circuit can be either one of the plurality of sub-circuits in step 11 or a sub-circuit of another schematic of another circuit design. Subsequently, at least one of the plurality of sub-circuits in step 11 can be identified by detecting a difference between the topology of the said at least one sub-circuit and the topology of the selected sub-circuit, wherein the difference is either null or within a pre-defined tolerance, as in step 13. The said at least one sub-circuit refers to a candidate sub-circuit, which means that each instance in the candidate sub-circuit has a corresponding instance in the selected sub-circuit, and the topology of the candidate sub-circuit and the topology of the selected sub-circuit are either similar or identical. Once the candidate sub-circuit is recognized, the layout pattern of the selected sub-circuit is then duplicated, as in step 14; and the new copy is then associated to the candidate sub-circuit, as in step 15.

Figure 2A:
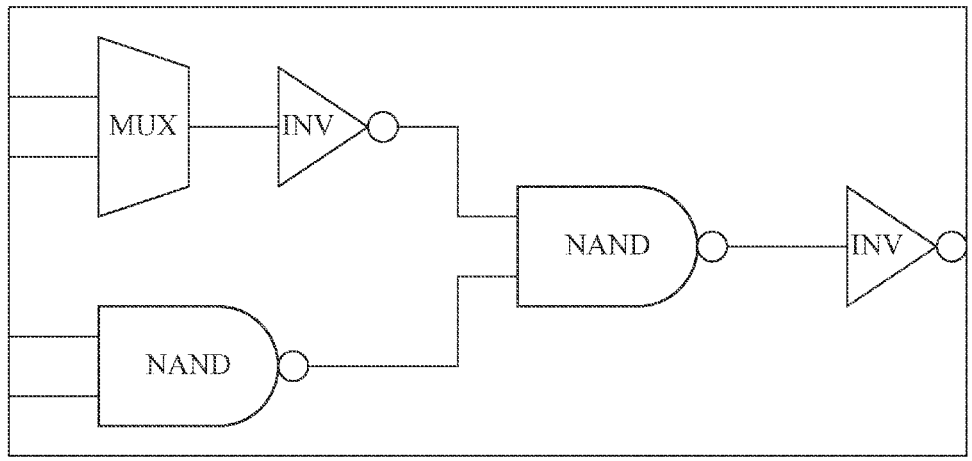
FIG. 2A, FIG. 2B and FIG. 2C illustrate a sub-circuit, a topology thereof, and a topology along with interconnections among the instances of the sub-circuit.
Figure 2B:
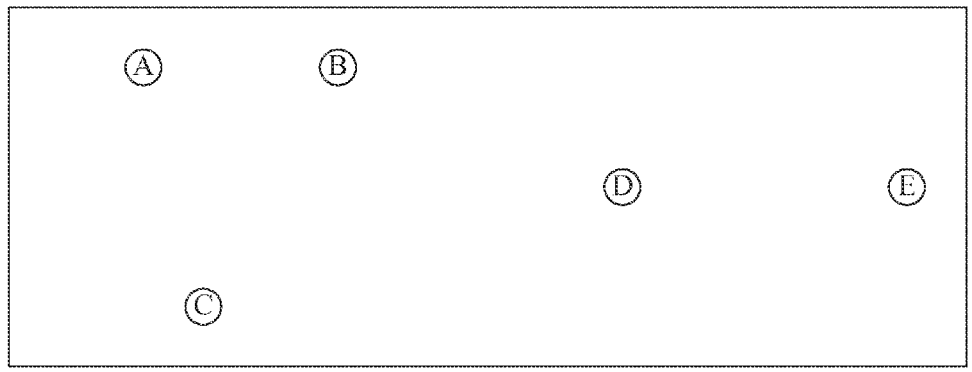
Figure 2C:
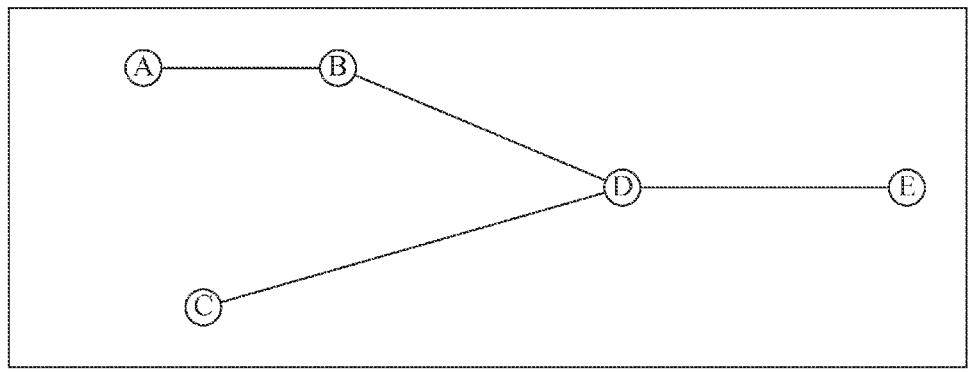
Figure 3:
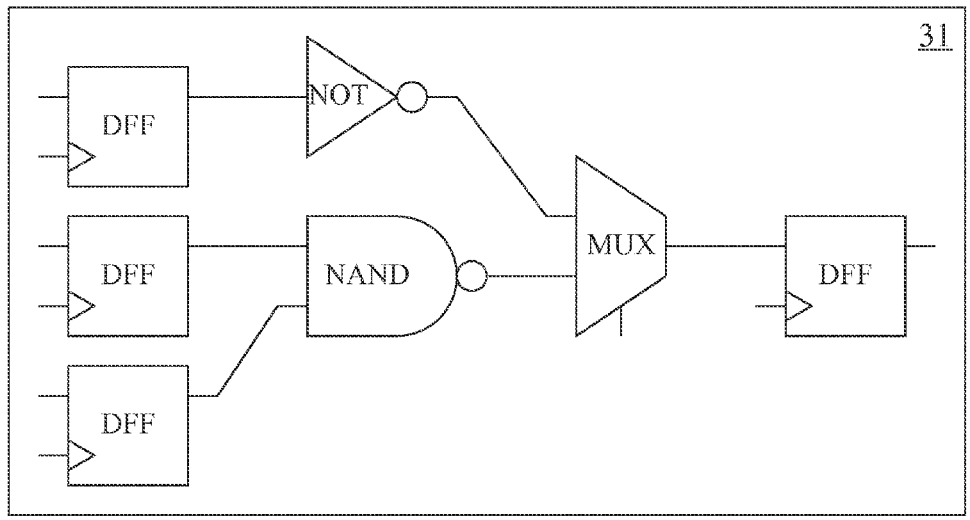
FIG. 3 illustrates two sub-circuits with the same topology but different interconnections among the instances.
Figure 3:
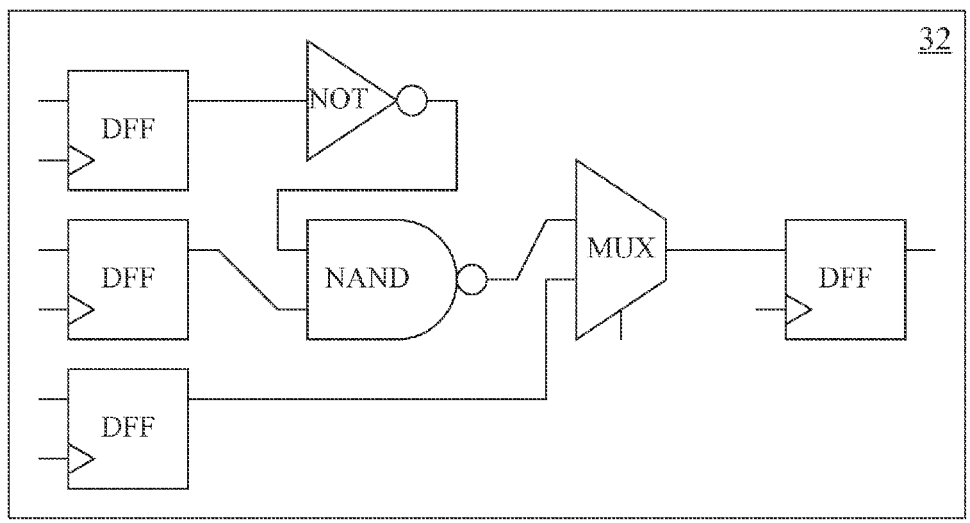

Please refer to FIG. 2A to FIG. 2C. FIG. 2A is an example of a sub-circuit which comprises a plurality of instances. In FIG. 2B, each of the plurality of instances in FIG. 2A is treated as a node (A~E), and the plurality of interconnections among instances are ignored so as to form a topology representing the relative positions among the plurality of instances. In FIG. 2C, the interconnections among the plurality of instances are also shown along with the topology. Based on the definition above, two sub-circuits can be compared according to their topologies. For example, FIG. 3 illustrates two sub-circuits, sub-circuits 31 and 32, which are two different sub-circuits with the same topology but different interconnections among the plurality of instances. Although the interconnections are different, the layout of one sub-circuit can be reused initially for the layout of the other. The user can subsequently edit the initial layout to address the differences in interconnection. In most cases, this approach is still much faster than doing the layout for the second sub-circuit from scratch. With the conventional netlist driven layout method, these two sub-circuits are treated as different circuits and the layout wouldn't be reused. However, these two sub-circuits can be recognized as having an identical topology. As a result, the layout of sub-circuit 31 can be duplicated, and the new copy is then associated to sub-circuit 32. This can save time.

Based on the definition above, in one embodiment, an instance $D_n$ of a sub-circuit can be tagged with some information as shown below:

$\{T_n, P_n, (X_n, Y_n)\}$ wherein $T_n$ denotes the model type of the instance $D_n$, for example, which type of MOSFET a transistor is or what kind of logic a gate is; $P_n$ is the set of the parameters thereof, such as the width and the length of a transistor or the number of inputs of a gate; and $(X_n, Y_n)$ is the position of the instance $D_n$. If the type and parameters of any two instances are identical, these two instances are recognized as identical instances.

Therefore, the topology of each sub-circuit in the IC design can be described by the definition above. Furthermore, differences between any two topologies can be detected accordingly.

Figure 1:
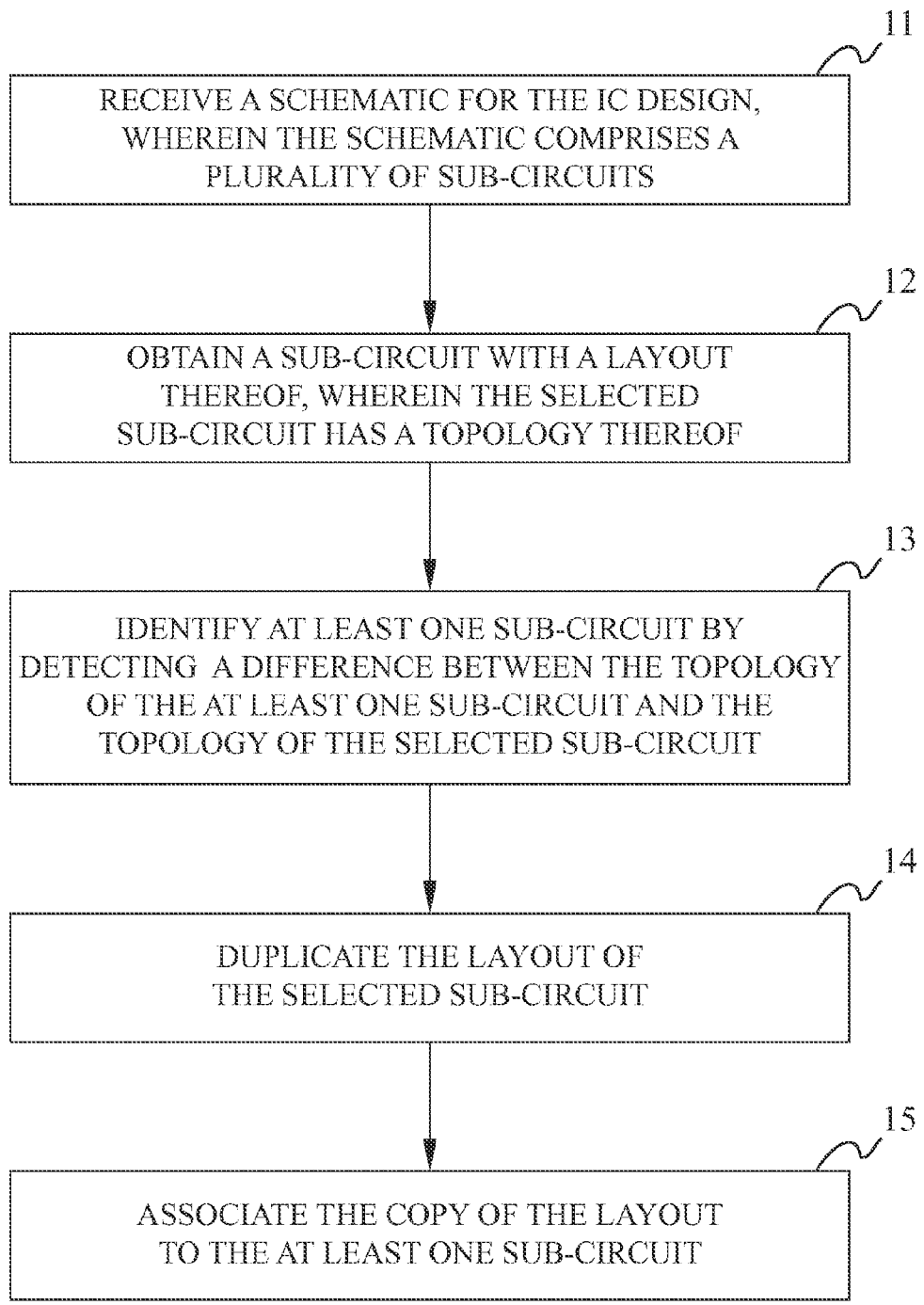
FIG. 1 is a flowchart in accordance with one embodiment of this invention.
Figure 4:
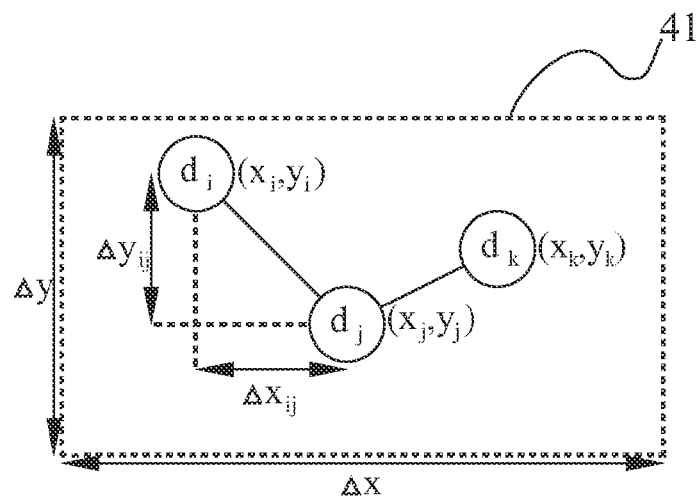
FIG. 4 illustrates how to recognize topology with tolerance.
Figure 4:
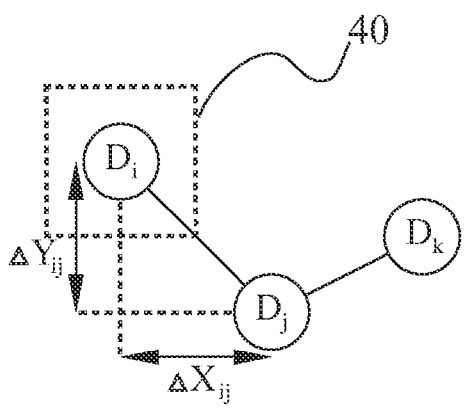

Please refer to FIG. 4 which illustrates an example of identifying a sub-circuit as mentioned in step 13 of FIG. 1. The selected sub-circuit is denoted as 41 and comprises instances $d_i$, $d_j$, and $d_k$, tagged with $\{t_i, p_i, (x_i, y_i)\}$, $\{t_j, p_j, (x_j, y_j)\}$, and $\{t_k, p_k, (x_k, y_k)\}$ respectively. One of the plurality of sub-circuits is denoted as 40 and comprises instances $D_i$, $D_j$, and $D_k$, tagged with $\{T_i, P_i, (X_i, Y_i)\}$, $\{T_j, P_j, (X_j, Y_j)\}$, and $\{T_k, P_k, (X_k, Y_k)\}$ respectively.

At the beginning, the devices with the same model type $d_i$ and $D_i$ ($t_i=T_i$ and $p_i=P_i$) are matched. Then, $d_j$, which is the nearest instance to $d_i$, is selected as the second matching device. The $\Delta x$ and $\Delta y$ are the width and height of a reference bounding box which enclose the sub-circuit 41. Meanwhile, a search of the candidate device $D_j$ inside a corresponding candidate reference bounding box in 40 is performed, wherein $t_j=T_j$ and $p_j=P_j$. Then the equations below are calculated.

$\Delta x_{ij} = x_i - x_j, \Delta X_{ij} = X_i - X_j,$ $\Delta y_{ij} = y_i - y_j, \Delta Y_{ij} = Y_i - Y_j,$ $|\Delta x_{ij} - \Delta X_{ij}| \leq \Delta x \times p,$ $|\Delta y_{ij} - \Delta Y_{ij}| \leq \Delta y \times p,$ wherein p is a pre-defined constant.

If device $D_j$ satisfies the equations, the device nearest to $d_j$ in 41 is then selected and the steps above are repeated. The iteration continues until all devices in 41 are matched. If device $D_j$ fails to satisfy the equations, we shall select the next device inside the candidate reference bounding box. If no candidate device inside the candidate reference bounding box is found, the match fails and the searching is stopped for this candidate reference bounding box.

According to the steps described above, the topology searching method can find a candidate sub-circuit even though there is a minor difference in topology between the candidate sub-circuit and the pattern sub-circuit. For example, if the distance between two instances in the pattern sub-circuit is not exactly the same as in the candidate sub-circuit but within a tolerance, the topology searching method can identify them and ignore the minor difference. In addition, the internal connection relationship is ignored in the topology searching method. Thus, sub-circuits with similar topologies can be recognized with less constraint.

Figure 5:
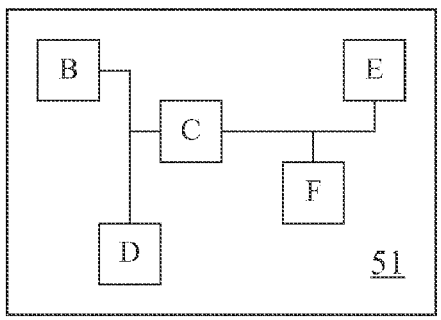
FIG. 5 illustrates a sub-circuit and the various topologies thereof.
Figure 5:
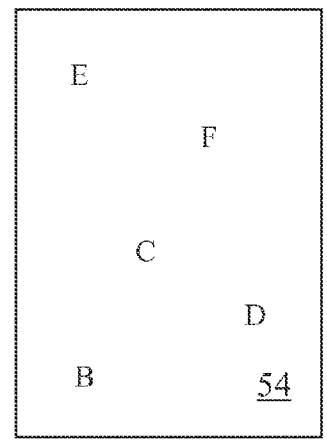
Figure 5:
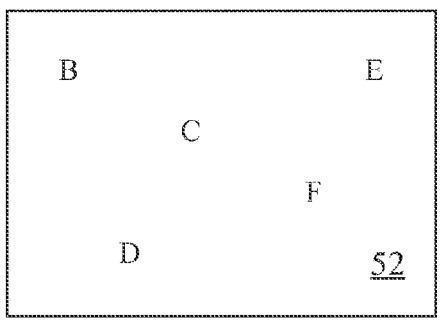
Figure 5:
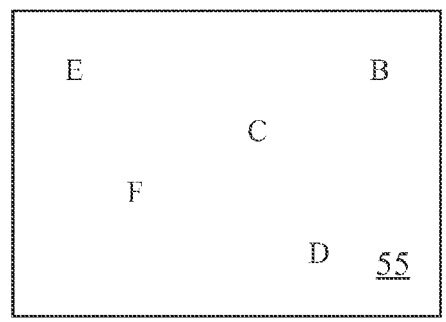
Figure 5:
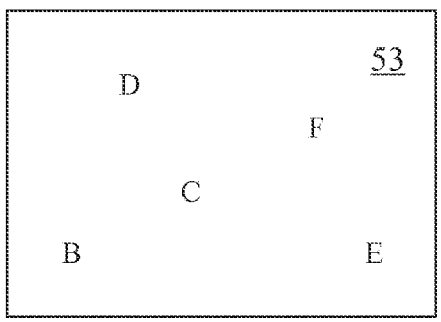
Figure 5:
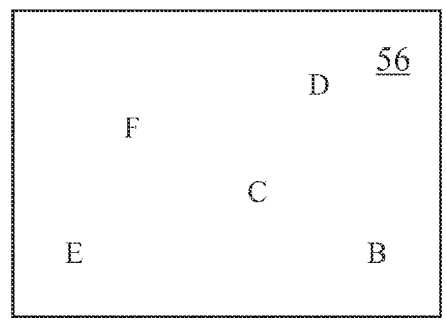

In one embodiment, once a pattern sub-circuit is selected, detecting the difference between the topology of a candidate sub-circuit and the topology of the selected sub-circuit is performed by comparing a one-dimensional mirror of the topology of the candidate sub-circuit with the topology of the selected sub-circuit. Referring to FIG. 5, there is one of the plurality of sub-circuits 51 and its corresponding topology is 52. The topology 53 is a mirror image of the topology 52 relative to the x axis, and the topology 55 is a mirror image of the topology 52 relative to y axis. In accordance with the embodiment, one-dimensional mirror images, topology 53 and topology 55, are also candidates to be compared with the topology of the selected sub-circuit.

In one embodiment, detecting the difference between the topology of a candidate sub-circuit and the topology of the selected sub-circuit is performed by comparing a two-dimensional mirror of the topology of the candidate sub-circuit with the topology of the selected sub-circuit. The topology 56 is a mirror image of the topology 52 relative to the x axis and the y axis. In accordance with the embodiment, two-dimensional mirroring topology 56 is also a candidate to be compared with the topology of the selected sub-circuit.

In one embodiment, detecting the difference between the topology of a candidate sub-circuit and the topology of the selected sub-circuit is performed by comparing the rotated topology of the candidate sub-circuit with the topology of the selected sub-circuit. The topology 54 is a 90 degree counter-clockwise rotation of the topology 52. In accordance with the embodiment, a rotated topology 54 is also a candidate to be compared with the topology of the selected sub-circuit.

In another embodiment, instead of detecting the differences between topologies of the selected sub-circuit and a candidate sub-circuit, only the device types (and parameters) of the instances and the interconnections among the instances of the selected sub-circuit and the interconnections in the corresponding instances of the candidate sub-circuit are compared. The topologies in the schematic are ignored. If the device types and parameters of corresponding instances are the same, and if the interconnections between corresponding instances are also the same, the layout of the selected sub-circuit is duplicated for the candidate sub-circuit. This approach is intuitive comparing to the topology comparison approach described above because sub-circuits with identical instances and identical interconnections are by nature candidates for sharing layout designs regardless of how the sub-circuits are shown in the schematic.

Figure 6:
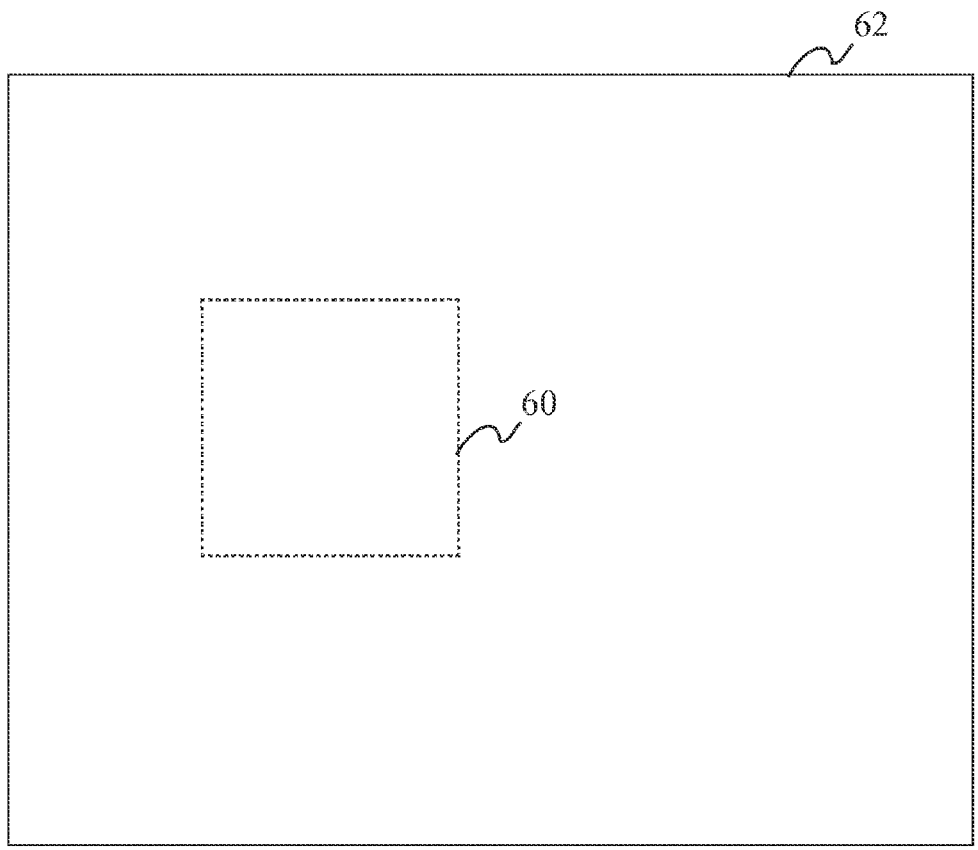
FIG. 6 illustrates a topology searching method which is performed in a specific scope in accordance with one embodiment of this invention.

In one embodiment, referring to FIG. 6, only a portion of the schematic of the circuit design is what the user concerns. Under such circumstance, searching all candidate sub-circuits in the whole schematic 62 is not merely time-consuming but also resource-wasting. Thus, once the selected sub-circuit is provided, the user then chooses a designated scope 60 in the whole schematic 62. In such case, the schematic driven method will only be performed in the designated scope to search candidate sub-circuits.

In one embodiment, a graphic user interface shows the candidate sub-circuits on display for user to confirm and select. In the user interface, the candidate sub-circuits not identical to the selected sub-circuit are indicated with the differences. As a result, the user can have enough information to select a candidate.

In one embodiment, the results are sorted in the sequence of correlation with a value denoting the score of correlation. Thus, those sub-circuits identical to the selected sub-circuit are shown on the top of the user interface; those with identical topology but different connection relationship are shown in subsequence; in the end of the user interface are other sub-circuits with identical internal instances but different topology or connection relationship.

After the candidate sub-circuits are recognized and confirmed, the layout pattern of the selected sub-circuit is copied and associated to each of the candidate sub-circuits, respectively. The user can then work on the new copies in the layout if necessary.

The method described above can be used for generating a layout for an IC design, such as analog IC design or mixed signal design, in an IC layout environment, or it can be used for generating a layout for a PCB in a PCB layout environment.

The method described above can also be used for generating layout constraints. Instead of creating the layout manually, constraint-driven placement and route tools may be used to automatically generate the layout based on a schematic input and a set of constraints. Typical constraints are such as matching constraints, symmetry constraints, and proximity constraints. The burden to the layout designer is then shifted from creating the actual layout to specifying a comprehensive set of constraints. After the layout designer specifies a plurality of constraints on a sub-circuit, the method described above can be used to copy the plurality of constraints for each identified sub-circuit in the schematic. This can greatly reduces the time and effort for the layout designer.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A computer-implemented method of generating a layout for a circuit design, the method comprising:

receiving a schematic of the circuit design, the circuit design comprising a plurality of sub-circuits, wherein each of the plurality of sub-circuits comprises a plurality of instances arranged according to a topology representing relative positions of the plurality of instances;

generating a layout pattern for each sub-circuit in one portion of the schematic;

selecting a first layout pattern of a first sub-circuit from said one portion of the schematics;

identifying, by using a computer, at least one sub-circuit in another portion of the schematic based on the difference between the topology of the identified sub-circuit and the topology of the first sub-circuit being within a predefined tolerance, wherein each instance of the identified sub-circuit has a corresponding instance in the first sub-circuit; and copying the first layout pattern to generate a layout pattern for the at least one identified sub-circuit, wherein the difference between the topology of the identified sub-circuit and the topology of the first sub-circuit satisfies the following:

$$\Delta x_{ij} = x_i - x_j, \Delta X_{ij} = X_i - X_j,$$

$$\Delta y_{ij} = y_i - y_j, \Delta Y_{ij} = Y_i - Y_j,$$

$$|\Delta x_{ij} - \Delta X_{ij}| \leq \Delta x \times p,$$

$$|\Delta y_{ij} - \Delta Y_{ij}| \leq \Delta y \times p,$$

wherein $x_i$, $x_j$, $y_i$, and $y_j$ are the X and Y coordinates of two instances in the topology of the identified sub-circuit; $X_i$, $X_j$, $Y_i$, and $Y_j$ are the X and Y coordinates of the corresponding instances in the topology of the first sub-circuit; Δx and Δy are the X span and Y span of the topology of the identified sub-circuit; and p is a pre-defined constant.

2. The computer-implemented method according to claim 1, wherein p is zero, such that the topology of the identified sub-circuit and the topology of the first sub-circuit are identical.

3. The computer-implemented method according to claim 1, wherein the difference between the topology of the identified sub-circuit and the topology of the first sub-circuit is determined by comparing a one dimensional mirror of the topology of the identified sub-circuit with the topology of the first sub-circuit.

4. The computer-implemented method according to claim 3, wherein said one dimensional mirror of the topology of the identified sub-circuit is relative to x axis or y axis.

5. The computer-implemented method according to claim 1, wherein the difference between the topology of the identified sub-circuit and the topology of the first sub-circuit is determined by comparing a two dimensional mirror of the topology of the identified sub-circuit with the topology of the first sub-circuit.

6. The computer-implemented method according to claim 5, wherein said two dimensional mirror of the topology of the identified sub-circuit is relative to x and y axes.

7. The computer-implemented method according to claim 1, wherein the difference between the topology of the identified sub-circuit and the topology of the first sub-circuit is determined by rotating the topology of the identified sub-circuit and comparing the rotated topology of the identified sub-circuit with the topology of the first sub-circuit.

8. The computer-implemented method according to claim 1, wherein a graphic user interface is provided to display the at least one sub-circuit along with the difference between the topology of the at least one sub-circuit and the topology of the first sub-circuit.

9. The computer-implemented method according to claim 1, wherein the at least one sub-circuit and the first sub-circuit are analog circuits.

10. The computer-implemented method according to claim 1, wherein the layout of the circuit is for an integrated circuit (IC).

11. The computer-implemented method according to claim 1, wherein the layout of the circuit design is for a printed circuit board (PCB).

* * * * *